United States Patent [19]
Tseng et al.

[11] Patent Number: 5,712,208
[45] Date of Patent: Jan. 27, 1998

[54] METHODS OF FORMATION OF SEMICONDUCTOR COMPOSITE GATE DIELECTRIC HAVING MULTIPLE INCORPORATED ATOMIC DOPANTS

[75] Inventors: Hsing-Huang Tseng; Philip J. Tobin; Keith E. Witek, all of Austin, Tex.

[73] Assignee: Motorola, Inc., Schaumburg, Ill.

[21] Appl. No.: 449,964

[22] Filed: May 25, 1995

Related U.S. Application Data

[63] Continuation-in-part of Ser. No. 258,360, Jun. 9, 1994.

[51] Int. Cl.$^6$ ............... H01L 21/225; H01L 21/3115
[52] U.S. Cl. ............... 438/770; 438/775; 438/923; 438/287
[58] Field of Search ............... 437/24, 46, 40, 437/41, 160, 162, 240, 241, 242

[56] References Cited

U.S. PATENT DOCUMENTS

| | | | |
|---|---|---|---|
| 3,560,810 | 2/1971 | Balk et al. | 317/235 |
| 4,003,071 | 1/1977 | Takagi | 357/42 |
| 4,621,277 | 11/1986 | Ito et al. | 357/54 |
| 4,748,131 | 5/1988 | Zietlow . | |
| 4,851,370 | 7/1989 | Doklan et al. | 437/225 |
| 5,034,798 | 7/1991 | Ohsima | 357/54 |
| 5,061,647 | 10/1991 | Roth et al. | 437/40 |
| 5,258,333 | 11/1993 | Shappir et al. | 437/235 |
| 5,286,994 | 2/1994 | Ozawa et al. | 257/411 |
| 5,294,820 | 3/1994 | Gemma et al. | 257/324 |
| 5,364,803 | 11/1994 | Lur et al. . | |
| 5,382,533 | 1/1995 | Ahmad et al. . | |
| 5,429,995 | 7/1995 | Nishiyama et al. . | |
| 5,462,812 | 10/1995 | Nguyen et al. . | |
| 5,552,332 | 9/1996 | Tseng et al. . | |

FOREIGN PATENT DOCUMENTS

| | | |
|---|---|---|
| 56-125875 | 10/1981 | Japan . |
| 58-17673 | 2/1983 | Japan . |
| 61-97866 | 5/1986 | Japan . |
| 2-265279 | 10/1990 | Japan . |
| 3-30470 | 2/1991 | Japan . |

OTHER PUBLICATIONS

S.S.Wong, et al., "Low Pressure Nitrided–Oxide as a Thin Gate Dielectric for MOSFET's", Solid–State Science and Technology, May 1983, pp. 1139–1143.

Aritome, S. et al., et al, "Low–Temperature Nitridation of Fluorinated Silicon Dioxide Films in Ammonia Gas", Appl. Phys. Lett. 51(13), Sep. 1987, pp. 981–983.

"Gate Dielectric Structure for Field–Effect Transistors," Li et al; IBM Technical Disclosure Bulletin, vol. 17, No. 8, Jan. 1875, p. 2330.

"Controlled Nitridation of SiO2 For the Formation of Gate Insulators in FET Devices," IBM Technical Disclosure Bulletin, vol. 28, No. 6, Nov. 1985, pp. 2665–2666.

"Improvement of the Gate–Region Integrity in FET Devices," Abbas et al; IBM Technical Disclosure Bulletin, vol. 14, No. 11 (1972).

"Improvement of Thin–Gate Oxide Integrity Using Through–Silicon–Gate Nitrogen Ion Implantation," Haddad et al; 1987 IEEE Electron Device Letters pp. 58–60.

"Electrical and Reliability Characteristics of Ultrathin Oxynitride Gate Dielectric Prepared by Rapid Thermal Processing in N2O," Hwang et al; IEDM 1990 pp. 421–424.

(List continued on next page.)

*Primary Examiner*—George R. Fourson
*Attorney, Agent, or Firm*—Keith E. Witek

[57] ABSTRACT

A semiconductor dielectric (10) is formed by providing a base layer (12) having a surface. A thin interface layer (13) is formed at the surface of the base layer (12). The thin interface layer has a substantial concentration of both nitrogen and fluorine. A thermal oxide layer (14) is formed overlying the interface layer (13). A deposited dielectric layer (16) is formed overlying the thermal oxide layer (14). The deposited dielectric layer (16) is optionally densified by a thermal heat cycle. The deposited dielectric layer (16) has micropores that are misaligned to micropores in the thermal oxide layer (14) to provide enhanced features which the nitrogen/fluorine interface further improves the dielectric's features.

19 Claims, 5 Drawing Sheets

OTHER PUBLICATIONS

"Improvements in Rapid Thermal Oxide/Re–Oxidized Nitrided Oxide (ONO) Films Using NF3," Cable et al; Mat. Res. Soc. Symp. Proc. vol. 224 (1991) pp. 403–408.

*Research Disclosure*; Nov. 1979, No. 18756.

"Suppression of Boron Penetration into an Ultra–Thin Gte Oxide by Using a Stacked–Amorphous–Silicon (SAS) Film"; Wu et al; IEDM 1993, pp. 329–332.

"Nitridation Induced Surface Donor Layer in Silicon and It's Impact on the Characteristics of n–and p–Channel Mosfets"; Wu et al; IEDM 1989, pp. 271–274.

"Fabrication of Superior Oxynitride Ultrathin MOS Gate Dielectrics for ULSI Technology by Reactive Rapid Thermal Processing," Kwong et al; SPIE vol. 1189 Rapid Isothermal Processing (1989).

Wolf, S., et al, *Silicon Processing For the VLSI Era; vol. 1, Process Technology*, Lattice Press, 1986, p. 183.

"Improvement in SiO2 Gate Dielectrics with Fluorine Incorporation," Wright et al, 1989 Symposium on VLSI Technology, pp. 51–52.

METHODS OF FORMATION OF SEMICONDUCTOR COMPOSITE GATE DIELECTRIC HAVING MULTIPLE INCORPORATED ATOMIC DOPANTS

This is a continuation-in-part of application Ser. No. 08/258,360, filed Jun. 9, 1994.

FIELD OF THE INVENTION

The present invention relates generally to semiconductor technology, and more particularly, to composite semiconductor dielectrics.

BACKGROUND OF THE INVENTION

Dielectric materials are frequently used in the formation of integrated circuit devices. Dielectric materials are used to form gate oxides for metal oxide semiconductor field effect transistors (MOSFETs), capacitor dielectrics, inter-polysilicon dielectrics, inter-metal dielectrics, final passivation layers, sacrificial layers, masking layers, and like structures. In most cases, the most critical oxide in an integrated circuit device is the gate oxide.

There are two conventional and widely used methods of forming a gate oxide. Both methods of forming the gate oxide require exposure of a silicon material to an oxygen-containing ambient and elevation of an ambient temperature. A wet silicon dioxide or a dry silicon dioxide material is formed over the silicon material when using this method. Wet and dry oxides are used frequently to form gate oxides. Silicon dioxide materials have several known disadvantages, such as boron penetration between a gate and a channel region, hot carrier injection problems, and a defect density and micropores which cause reduced breakdown voltages and reduced transistor lifetime.

In order to improve gate oxides, nitrogen has been added to gate oxides. This nitrogen, while providing benefits, such a boron penetration reduction, provides disadvantages such as reduced channel region conductivity (resulting in slower switching speeds through transistors).

In addition, in order to improve gate oxide interface properties and enhance channel conductors, fluorine has been added to gate oxides. One disadvantage with fluorine is that it can enhance undesireable boron penetration from a boron-doped gate electrode. Therefore, a need exists for a new gate dielectric which reduces boron penetration between a gate and a channel region, hot carrier injection problems, and a defect density and micropores while also reducing other problems associated with fluorine and conductivity problems associated with nitrogen.

DESCRIPTION OF THE PREFERRED EMBODIMENT

Generally, the present invention teaches a method for forming a composite dielectric layer having a nitrogen and fluorine doped interface region. First, FIGS. 1-12 illustrate a method for forming a composite dielectric, then FIGS. 13-18 illustrate how to form a nitrogen/fluorine doped thermal oxide layer, then FIG. 19 illustrates how to couple together the teaching of FIGS. 1-12 and FIGS. 13-18 to form a superior gate dielectric. The composite dielectric layer has a bottom thermally grown layer and a top deposited dielectric layer. Due to the fact that the bottom and top portions of the composite dielectric are formed of different methods (one thermally grown and one deposited), the top and bottom portions have misaligned micropores which reduce current leakage and breakdown. Micropores are tiny "cracks" through the oxide that can result in early failures of gate dielectrics and the destructive ability of these micropores is eliminated or reduced by the misaligning of the micropores.

In addition to the benefit of the misaligned micropores, a nitrogen/fluorine interface region is formed below the gate dielectric. Nitrogen-rich interfaces and fluorine rich interfaces are known but the combination of the two with a composite dielectric is not known and produces a far superior gate dielectric region. The nitrogen and fluorine interface has advantages over a purely fluorine or purely nitrogen interface. Too much nitrogen at an interface will adversely affect carrier mobility though a channel region whereas too much fluorine in a region can combine with hydrogen from the environment to form HF and etch material which is not to be etched near the channel region. In addition, a high fluorine concentration will enhance boron-penetration and affect threshold voltage stability of a transistor. Therefore, by combining nitrogen and fluorine, one can make a dielectric interface that adequately reduces interface states while reducing the mobility problems, etching problems, and boron penetration problems of nitrogen or fluorine alone. Therefore, the composite gate dielectric taught herein is superior in breakdown resistance, leakage current, etching problems, boron penetration resistance, and mobility constraints over all known gate oxides.

Figure 1:
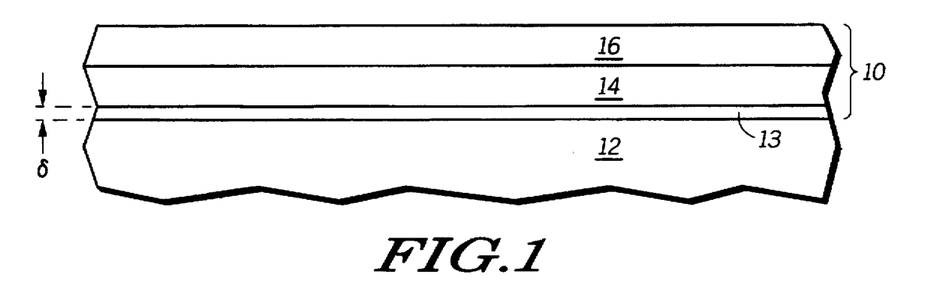
FIG. 1 illustrates, in cross-sectional form, a semiconductor dielectric in accordance with the present invention.

Illustrated in FIG. 1 is a semiconductor dielectric 10. In order to form semiconductor dielectric 10, a base layer 12 which has a surface is provided. In most cases, the base layer 12 is a substrate material. Substrate materials include but are not limited to silicon, gallium arsenide, silicon on sapphire, epitaxial formations, germanium, germanium silicon, polysilicon, and/or like substrate materials. In other cases, the base layer may be a transistor gate electrode, a transistor floating gate material for a memory cell, a polysilicon interconnect or layer, amorphous silicon, or a like conductive material. If semiconductor dielectric 10 is formed over a dielectric layer, then the dielectric layer is a base layer. It is important to note that the semiconductor dielectric 10 may be formed either over a base layer or under a base layer.

In one form, an oxynitride-fluorinated layer is formed overlying the base layer 12. The oxynitride-fluorinated layer forms a thin interface region referred to as a thin interface layer 13 at the surface of the base layer 12. The thin interface layer 13 has a substantial or detectable concentration of nitrogen and fluorine. The thin interface layer 13 is labeled in FIG. 1 as having a thickness d. The thickness d indicates that the interface layer 13 is a thin layer. The thickness d is used in subsequent figures to represent a thin layer or a thin region. The oxynitride-fluorinated layer also forms a thermal oxide layer 14. The thermal oxide layer 14 is preferably either a wet or dry silicon dioxide ($SiO_2$) material.

A deposited dielectric layer 16 is formed overlying the thermal oxide layer 14. Chemical vapor deposition (CVD), plasma enhanced chemical vapor deposition (PECVD), low pressure chemical vapor deposition (LPCVD), or a like deposition process is used to form the deposited dielectric layer 16. Many dielectric materials which are formed via deposition are known, but a high temperature oxide (HTO) or a tetraethylorthosilicate (TEOS) based oxide is preferred for the dielectric layer 16. In addition, a low temperature oxide (LTO) may be used although an LTO may not be as dense or defect-free as an HTO or a TEOS oxide. Subsequent to formation or during formation, the dielectric layer 16 is heated to densify the deposited dielectric layer 16. Densification of the deposited dielectric layer 16 is not always necessary, but will result in a deposited dielectric layer 16 of improved quality.

The semiconductor dielectric 10 of FIG. 1 may be formed via a method wherein the thermal oxide layer 14 or total dielectric layer 10 is exposed to a nitrogen-containing ambient along with a fluorine-containing ambient. In one form, FIG. 1, the base layer is exposed to an ambient containing $O_2$, $NF_3$, and (NO, $N_2O$, and/or $NH_3$) or a like fluorine, nitrogen, and oxygen containing ambient. Due to the fluorine, nitrogen, and oxygen in the ambient, the thin interface layer 13 is formed as a thin region with a thickness of d. The interface layer 13 contains a substantial or detectable concentration of fluorine and nitrogen. The thermal oxide layer 14 forms in a thermal manner by consuming some of the base layer 12 to form $SiO_2$. The deposited dielectric layer 16 is formed and optionally densified as described above, and the semiconductor dielectric 10 is complete.

The thin interface layer 13, which has a high concentration of nitrogen and fluorine allows semiconductor dielectric 10 to be more radiation hard than most known dielectric materials. In addition, the semiconductor dielectric 10, if the thin interface layer 13 is made primarily of nitrogen/fluorine, reduces or eliminates a known boron penetration problem. Stress is reduced between the base layer 12 and the semiconductor dielectric 10 via the thin interface layer 13. The semiconductor dielectric 10, due to the combination of the deposited dielectric layer 16 and the thermal oxide layer 14, improves oxide integrity, reduces oxide leakage, reduces premature breakdown voltage failures due to the mismatch of defects in the composite thermal/TEOS dielectric layer, and improves integrated circuit lifetime. These advantages are achieved by the fact that the combination of the deposited dielectric layer 16 and the thermal oxide layer 14 reduces the effects of micropores. This phenomenon is discussed in more detail in reference to a subsequent figure.

In subsequent figures, elements that are analogous to elements in FIG. 1 are labeled identically.

Figure 2:
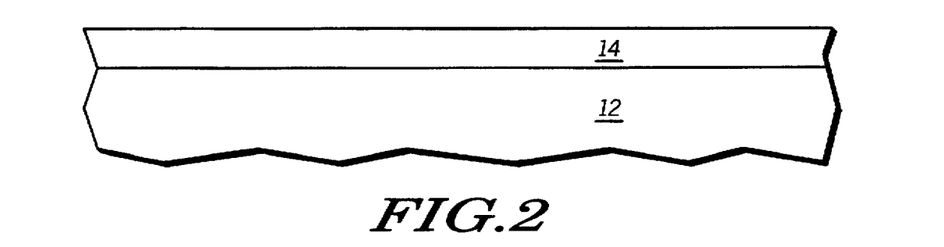
FIGS. 2-3 illustrate, in cross-sectional form, a method of forming a semiconductor dielectric in accordance with the present invention.
Figure 3:
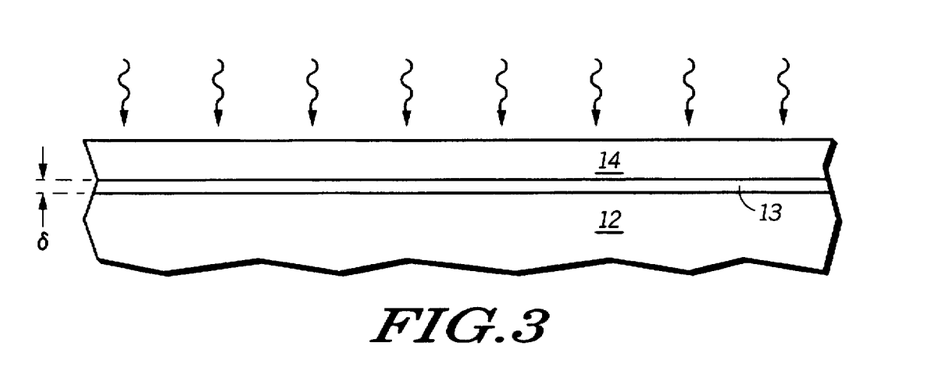

FIGS. 2–3 illustrate an alternative method that may be used to form the semiconductor dielectric 10. In FIG. 2, the thermal oxide layer 14 is grown over the base layer 12 which has a surface. Wet or dry techniques may be used to form the thermal oxide layer 14 as a silicon dioxide layer.

In FIG. 3, the thermal oxide layer 14 is exposed to an ambient which contains one of either $N_2O$ or $NH_3$, or a like nitrogen containing ambient, and a fluorine gas such as $NF_3$ to form the thin interface layer 13 which has a substantial concentration of nitrogen and fluorine. The nitrogen and fluorine diffuses to the surface of the base layer 12 and "piles up" to form the thin interface layer 13. Although not illustrated in FIG. 3, deposited dielectric layer 16 is formed and optionally densified over the thermal oxide layer 14 in FIG. 3 to form the semiconductor dielectric 10 of FIG. 1.

Figure 4:
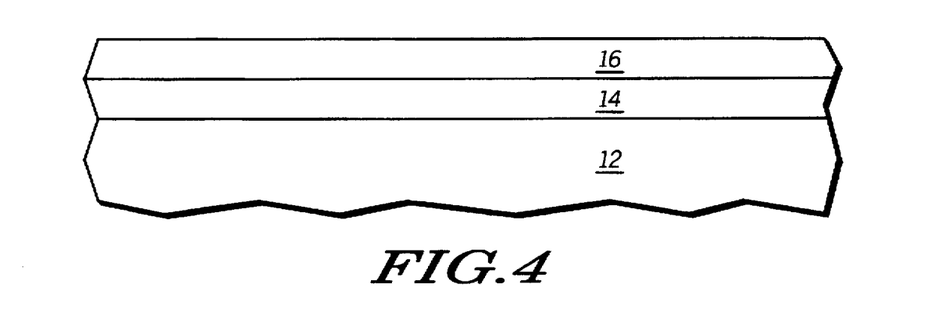
FIGS. 4-5 illustrate, in cross-sectional form, another method of forming a semiconductor dielectric in accordance with the present invention.
Figure 5:
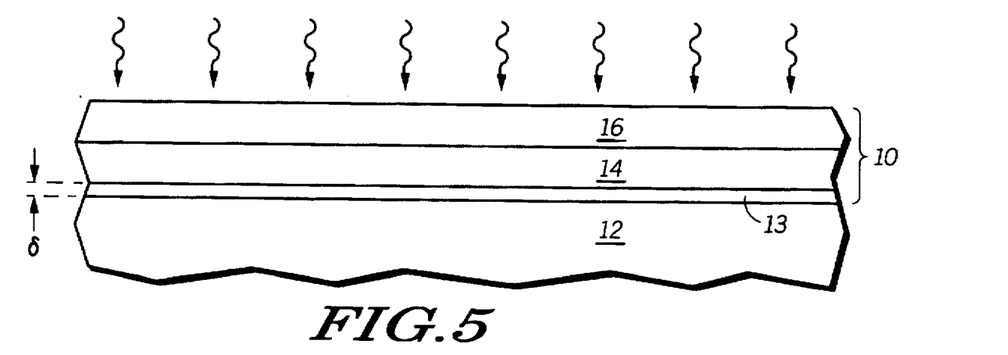

In FIGS. 4–5, yet another method for forming the semiconductor dielectric 10 of FIG. 1 is illustrated. In FIG. 4, both the thermal oxide layer 14 and the deposited dielectric layer 16 are formed. In FIG. 5, the dielectric layer 16 is exposed to an ambient which contains one of either $N_2O$ or $NH_3$, or a like nitrogen containing ambient, and $NF_3$ to form the thin interface layer 13 that has a substantial concentration of nitrogen/fluorine. Although not illustrated in FIG. 3, the deposited dielectric layer 16 is optionally densified as described herein.

In other words, FIGS. 1–5 indicate that exposure to nitrogen/fluorine can occur before or after the formation of the deposited dielectric layer 16 or even concurrently with the growth of the thermal oxide layer 14.

Figure 6:
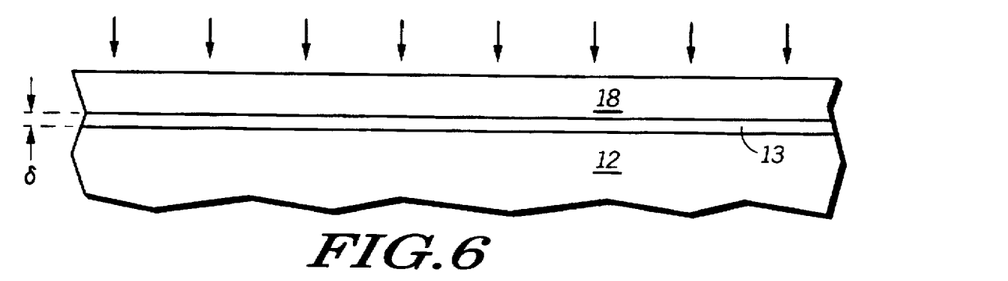
FIGS. 6-7 illustrate, in cross-sectional form, yet another method of forming a semiconductor dielectric in accordance with the present invention.
Figure 7:
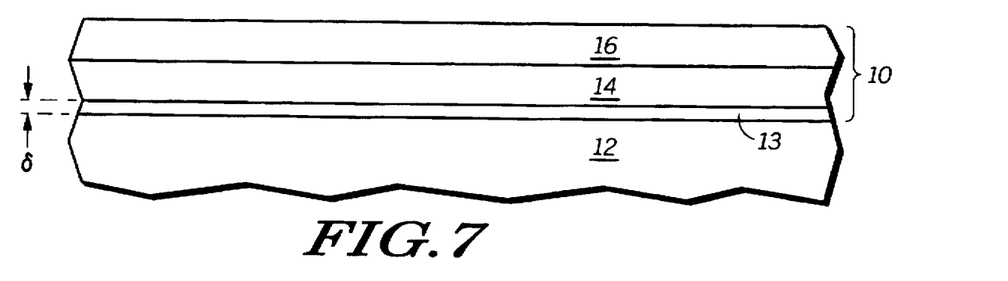

In FIGS. 6–7, an ion implantation method of forming the thin interface layer 13 is illustrated. In FIG. 6, a sacrificial dielectric layer 18 is formed over the base layer 12. The thin interface layer 13 does not exist before the formation of the sacrificial dielectric layer 18. An ion implantation step is used to ion implant a combination of nitrogen, fluorine, a nitrogen-containing compound, or a fluorine-containing compound into a region that is near a surface of the base layer 12. The implantation along with an optional heat cycle forms the thin interface layer 13 between the sacrificial dielectric layer 18 and the base layer 12 where the region 13 is both nitrogen and fluorine rich. The sacrificial dielectric layer 18 is then removed via conventional etch procedures.

In FIG. 7, the thermal oxide layer 14 and the deposited dielectric layer 16 are formed as discussed herein. The layers 14 and 16 are formed over the thin interface layer 13.

Figure 8:
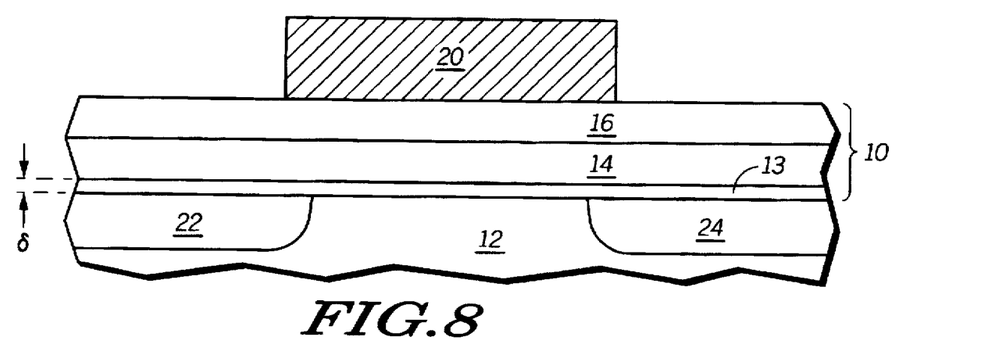
FIG. 8 illustrates, in cross-sectional form, the semiconductor dielectric of FIG. I being used as a transistor gate dielectric.

In FIG. 8, the semiconductor dielectric 10 of FIG. 1 is used as a gate oxide for a field effect transistor (FET). The layers 13, 14, and 16 are formed as described above. The base layer 12 is a silicon substrate. A gate electrode 20 is formed overlying the deposited dielectric layer 16 via conventional techniques. A source electrode 22 and a drain electrode 24 are formed using conventional processing techniques.

The layers 13 and 14, due to the presence of nitrogen, reduce boron penetration between the gate electrode 20 and the base layer 12. The combination of nitrogen and fluorine along with a composite dielectric at the interface of the substrate reduce stress between the layer 14 and the base layer 12, increase transistor lifetime, increase transistor radiation hardening, reduce premature breakdown voltage failures, and/or reduce leakage current through layers 13, 14, and 16. In order to get the above benefits with just nitrogen, one must use an X concentration of nitrogen. In order to get the above benefits with just fluorine one would need an X concentration of fluorine. By combining nitrogen and fluorine one can get the same above benefits with an X/2 concentration of nitrogen and an X/2 concentration of fluorine wherein the aggregate of nitrogen and fluorine is still of X concentration since X/2+X/2=X. Even though the aggregate is the same and the same benefit is achieved for the dielectric layer 10, several disadvantages are reduced by the X/2 concentration versus the X concentration. The X/2 concentration of nitrogen versus the X concentration of nitrogen results in reduction of channel charge mobility problems associated with nitrogen. The reduction in fluorine from X to X/2 in concentration results in less HF etching associated with fluorine at an interface. Therefore, the above gate dielectric which uses a composite thermal/deposited structure and both nitrogen and fluorine at an interface reduces negative effects of nitrogen and fluorine when used alone while attaining the same level of benefits, such as reduced boron penetration between the gate electrode 20 and the base layer 12, reduce stress between the layer 14 and the base layer 12, increase transistor lifetime, increase transistor radiation hardening, reduce breakdown voltage failures, and/or reduce leakage current through layers 13, 14, and 16.

Furthermore, the layers 13, 14, and 16 may be used to form a tunnel oxide for an electrically erasable programmable read only memory (EEPROM) or an erasable programmable read only memory (EPROM). The tunnel oxide is used to program or erase a floating gate via known tunneling or known hot carrier injection of electrical carriers. A set of layers (not illustrated) similar to the layers 13, 14, and 16 are optionally used to insulate a floating gate from a control gate. The set of layers (not illustrated) are formed overlying an upper surface and adjacent a sidewall of the floating gate in order to insulate the floating gate from the control gate.

Figure 9:
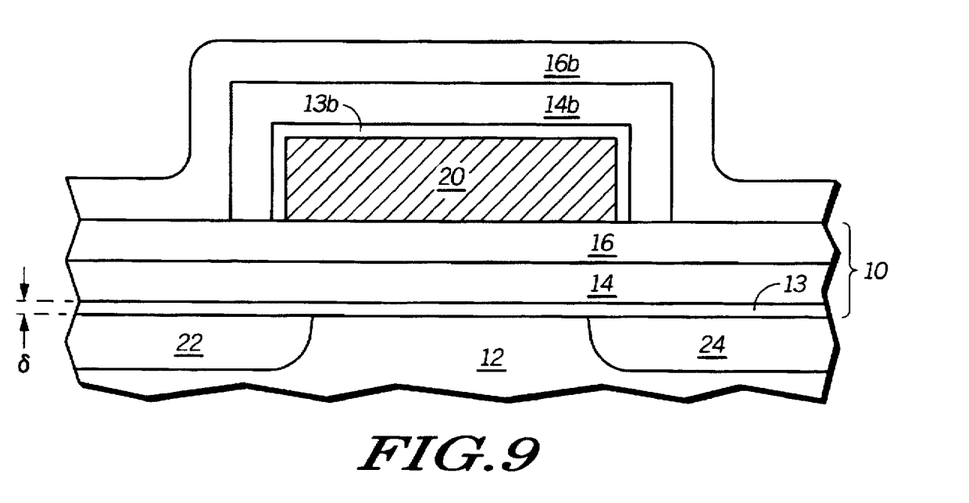
FIG. 9 illustrates, in cross-sectional form, the semiconductor dielectric of FIG. I being used to insulate a transistor gate electrode.

In FIG. 9, the transistor of FIG. 8 is illustrated with additional materials overlying the gate electrode 20. In FIG. 9, a transistor is formed as described in reference to FIG. 8 with semiconductor dielectric 10 functioning as a gate dielectric. The gate electrode 20, if made of a silicon-based material, is processed as a base layer via one of the methods described in reference to FIGS. 1–7. This processing forms a thin interface layer 13b which is overlying and surrounding all exposed surfaces of the gate electrode 20. Thin interface layer 13b is formed in a manner similar to thin interface layer 13. A thermal oxide layer 14b is then formed overlying thin interface layer 13b in a manner that is similar to the formation of thermal oxide layer 14. A deposited dielectric layer 16b is formed overlying the thermal oxide layer 14b in a manner that is similar to the formation of deposited dielectric layer 16. The layers 13b, 14b, and 16b are formed to prevent boron penetration into or out from the gate electrode 20. In addition, stress exerted on the transistor is reduced while HF etching and nitrogen impaired mobility is reduced.

Figure 10:
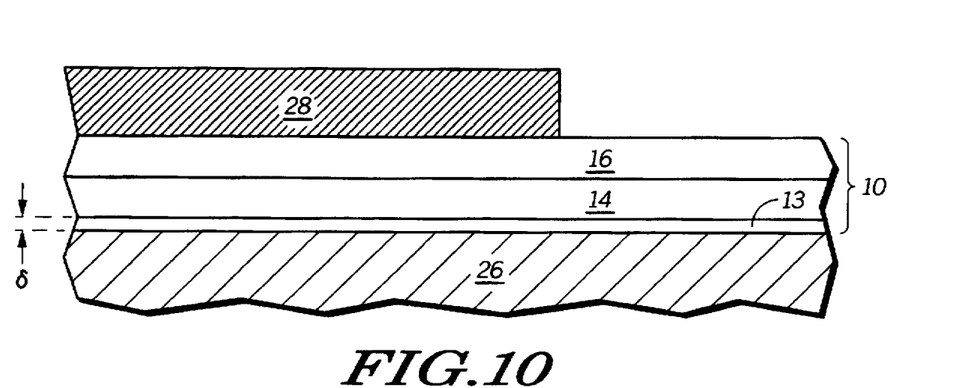
FIG. 10 illustrates, in cross-sectional form, the semiconductor dielectric of FIG. I being used to insulate a first conductive layer from a second conductive layer.

FIG. 10 illustrates semiconductor dielectric layer 10 which is used as either an inter-polysilicon dielectric layer or an inter-conductor dielectric layer. In FIG. 10, semiconductor dielectric 10 is used to isolate a base layer 26, which is a silicon-based material, from a conductive layer 28. Conductive layer 28 may be either a salicided material, a silicided material, polysilicon, amorphous silicon, single-crystalline silicon, metal, epitaxial silicon, germanium silicon, or a like conductive material. Therefore, the semiconductor dielectric 10 in FIG. 10 is used to isolate a first conductor from a second conductor.

Figure 11:
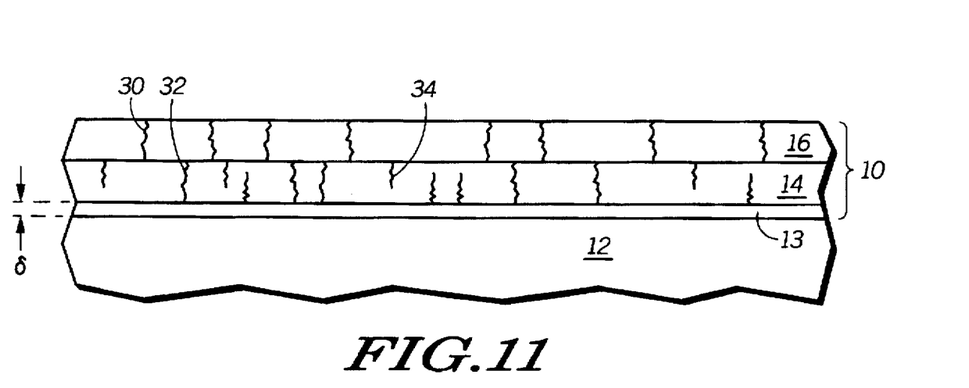
FIG. 11 illustrates, in cross-sectional form, micropore formation in the semiconductor dielectric of FIG. 1.

FIG. 11 illustrates how dielectric layer 10 is able to reduce breakdown voltage failures, reduce leakage, and increase lifetime of integrated circuits. FIG. 11 is a more detailed illustration of FIG. 1. FIG. 11 illustrates base layer 12, the interface layer 13, thermal oxide layer 14, and deposited dielectric layer 16. When any dielectric layer is formed, especially a gate oxide or any other thin oxide, a defect known as a micropore is usually formed. Micropores, such as micropores 30, 32, and 34, are illustrated in FIG. 11. Other micropores are illustrated in FIG. 11, but are not labeled. Micropores are defects that occur in thin oxide layers. Many of the micropores form completely from a top surface of a thin oxide layer to a bottom surface of the thin oxide layer, as illustrated via micropores 30 and 32. In some cases, the micropores may only partially form through an oxide layer as illustrated via micropore 34. The micropores that run completely through an oxide layer are defects that increase breakdown voltage problems, decrease integrated circuit lifetime, and increase leakage current.

The formation of thermal oxide layer 14 results in micropores in the thermal oxide layer 14. The formation and optional densification of the deposited dielectric layer 16 forms micropores in the deposited dielectric layer 16. The micropores in the layer 14 are most likely not aligned with the micropores in the layer 16 as illustrated. Therefore, a large number of micropores will not run entirely through the semiconductor dielectric 10. The misalignment of defects or misalignment of micropores results in semiconductor dielectric 10 being more robust than conventional dielectrics and having reduced breakdown voltage problems, reduced integrated circuit lifetime, and reduced leakage current as described herein.

Figure 12:
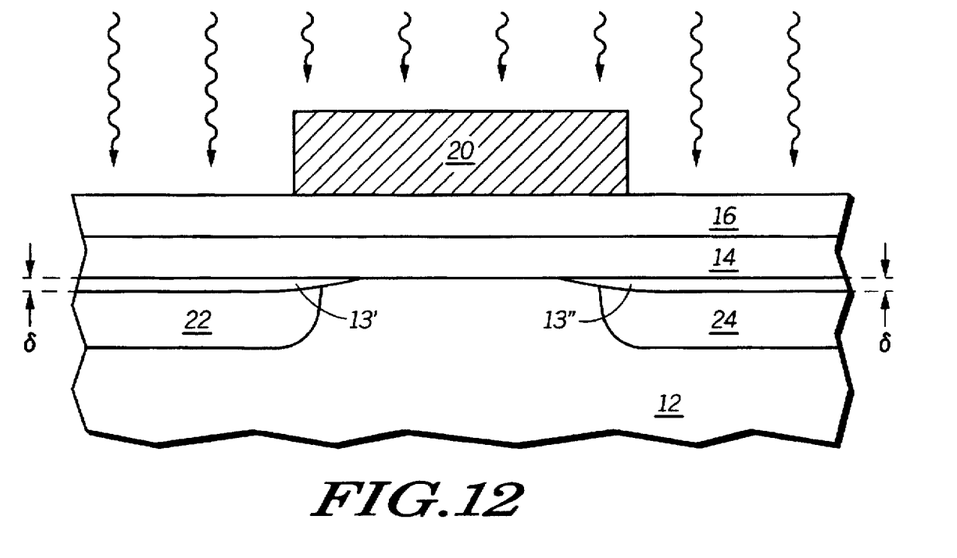
FIG. 12 illustrates, in cross-sectional form, selective formation of a barrier region adjacent a transistor gate, the formation being in accordance with the present invention.

FIG. 12 illustrates a structure having selective formation of a thin interface region. In FIG. 12, or base layer 12 is provided. In a preferred form, the base layer 12 is a substrate made of silicon. Thermal oxide layer 14 and deposited dielectric layer 16 are formed overlying the base layer 12. Gate electrode 20, source electrode 22, and drain electrode 24 are formed in a conventional manner to form a transistor. The transistor is exposed to either a fluorine-containing or a nitrogen-containing ambient while being heated. Thin interface regions 13' and 13" containing a detectable concentration of either nitrogen or fluorine are formed adjacent the gate electrode 20. Thin interface regions 13' and 13" are similar to the thin interface region 13 discussed herein for FIGS. 1–11. The thin interface regions 13' and 13" are formed at a surface of the base layer 12 and are underlying the thermal oxide layer 14. The extent to which the thin interface regions 13' and 13" extend under the gate electrode will vary based on processing parameters and transistor materials.

In an alternative, as discussed below, the composite dielectric taught above may be created having a chlorine/fluorine/nitrogen interface since Cl is used to remove metallic contaminants and sodium.

FIGS. 13–18 illustrate two ways in which both nitrogen and fluorine can be incorporated into a dielectric layer or thermal oxide region. The methods of FIGS. 13–18 can easily be further incorporated with the teachings of FIGS. 1–12 to arrive at other methods to achieve a composite thermal/deposited gate dielectric with both nitrogen and fluorine at an interface.

FIGS. 13–18 provides a controllable method for forming a gate dielectric containing both nitrogen and fluorine. A surface portion of a semiconductor substrate is first oxidized in a nitrogen-containing oxidant ambient to form a nitrogen-containing dielectric. Then a gate electrode is formed overlying the nitrogen-containing dielectric. Next, fluorine is introduced, preferably through implanting, into the gate electrode to form a fluorinated gate electrode. An annealing step then drives the fluorine into the nitrogen-containing dielectric to form a fluorinated nitrogen-containing dielectric.

These and other features, and advantages, will be more clearly understood from the following detailed description taken in conjunction with the accompanying drawings. It is important to point out that the illustrations herein may not necessarily be drawn to scale, and that there may be other embodiments of the present invention which are not specifically illustrated. Additionally, as many of the same or substantially similar elements are illustrated through the various embodiments of the invention as illustrated in the figures, like reference numerals are used to describe the same or substantially similar elements.

Figure 13:
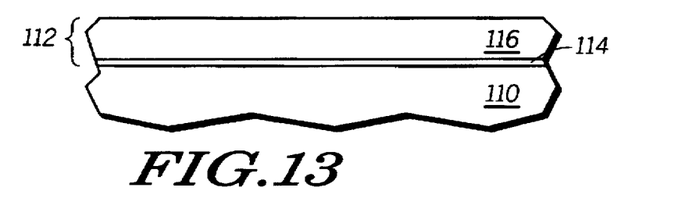
FIGS. 13-16 illustrate, in cross-section, process steps for forming a dielectric having improved performance in accordance with an embodiment of the invention.

FIGS. 13–16 illustrate, in cross-section, process steps for forming a dielectric having improved performance in accordance with an embodiment of the invention. In FIG. 13 a substrate 110 having a top surface portion is provided. Typical substrate materials include but are not limited to silicon, gallium arsenide, silicon on sapphire, epitaxial formations, germanium, germanium silicon, polycrystalline silicon, amorphous silicon, and/or like semiconductor substrate materials. Furthermore, the substrate may be a gate dielectric for a MOSFET, an interpolysilicon dielectric for a non-volatile memory cell, or a tunnel dielectric for a non-volatile memory cell. Additionally, the substrate 110 may be a floating gate material for a non-volatile memory cell, such as an EEPROM or EPROM, or a like material.

As illustrated in FIG. 13, a nitrogen-containing dielectric layer 112 is formed overlying the substrate 110. A preferred thickness range for the dielectric layer 112 is approximately 40–300 angstroms (Å). This dielectric layer 112 may be formed by oxidizing the top surface portion of the substrate 110. The oxidation is performed with a nitrogen-containing oxidant ambient, preferably $O_2$ mixed with or followed by one or more of nitrous oxide ($N_2O$), nitric oxide (NO), nitrogen dioxide ($NO_2$), or ammonia ($NH_3$). Alternatively, these oxidants may be mixed with steam for the oxidation process. Moreover, these oxidants are typically used in conjunction with other diluting gases or carrier gases such as argon (Ar), nitrogen ($N_2$), helium (He), or any noble gases, with varying concentrations depending upon the specific diluent. Alternatively, it is possible to form the nitrogen-containing dielectric layer 112 by first oxidizing the top surface portion of the substrate 110 with oxygen ($O_2$) or steam ($H_2O$) to form a thermal oxide layer. Then, an annealing step is performed with a nitrogen-containing ambient, such as nitrous oxide, nitric oxide, nitrogen dioxide, and ammonia to introduce nitrogen into the dielectric layer. In either method of forming the nitrogen-containing dielectric 112, it is expected that the nitrogen in this dielectric 112 is mostly concentrated at an interfacial region 114 between the dielectric 112 and the substrate 110. The layer 116 of the dielectric layer 112 is a thermal oxide layer underlying a deposited oxide layer as taught in FIGS. 1–12, preferably either a wet or dry silicon dioxide ($SiO_2$) material. The presence of nitrogen in this interfacial region acts to increase the transconductance of the semiconductor device (not shown) at high gate voltages.

Figure 14:
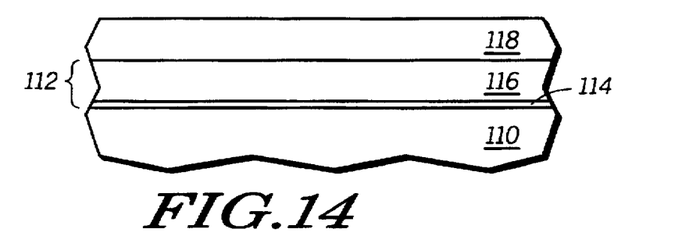

In FIG. 14, a gate electrode 118 is formed overlying the nitrogen-containing dielectric layer 112 which comprises a thermally grown portion underlying a deposited dielectric portion. The gate electrode 118 is a polysilicon gate and is preferably formed by low pressure chemical vapor deposition (LPCVD). Other deposition processes, such as standard CVD or plasma enhanced chemical vapor deposition (PECVD) may also be used. All of these foregoing deposition methods are well known in the art. An experimentally determined working temperature for the formation of the gate electrode 118 is 620° C. using LPCVD. A typical thickness range for this gate electrode 118 is approximately 1000–4000 Å, although no specific thickness is required.

Figure 15:
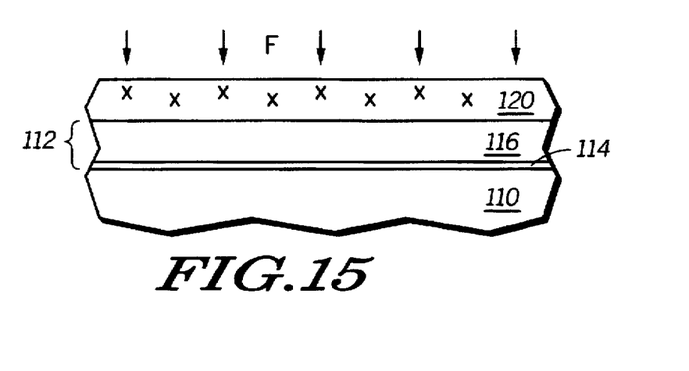

FIG. 15 illustrates a next step in this method of the invention where fluorine (F) is implanted into the gate electrode to form a fluorinated gate electrode 120. Implantation of fluorine is a controllable process making it suitable for a manufacturing environment where the introduction of controlled amounts of fluorine is desired. In an alternative form, F implantation can occur without the gate electrode 118 and can instead be performed only through the composite gate dielectric 116. The "x" in FIG. 3 is intended to depict the expected location of the fluorine ions within the gate electrode as a result of implantation. The implanting is preferably performed with pure fluorine ions with a dose ranging from $1 \times 10^{14} - 7 \times 10^{15}$, and energy ranging from 30–60 KeV. However, it is also possible to practice the present invention by implanting a fluorine-containing species which preferably does not contain a silicon dopant, such as boron, arsenic, or phosphorus. For example, it is possible to use $NF_3$ or $CF_3$ as implant species. It is important in practicing this invention to introduce nitrogen into the dielectric layer first before fluorine is introduced. The reason for this particular required sequence is that the fluorine-silicon bond is stronger than that of the nitrogen-silicon bond. Therefore, if fluorine were introduced first, then it becomes much more difficult to find available silicon to bond to nitrogen because the nitrogen cannot break the existing fluorine-silicon bonds. Thus, the sequence in the methods of the present invention provides a much more predictable and controllable process than the prior art.

Figure 16:
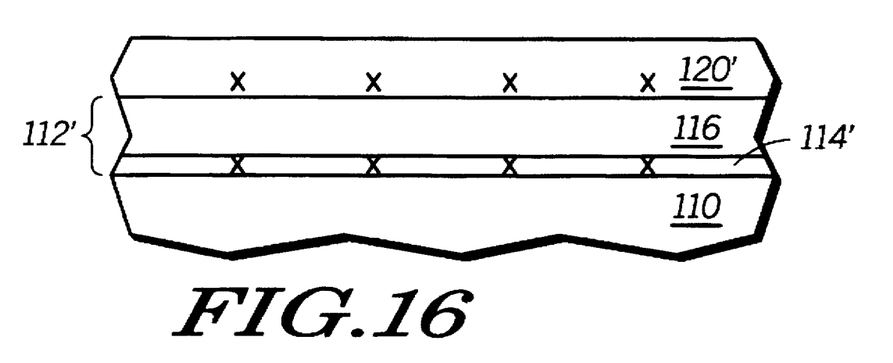

In FIG. 16, an annealing step is carried out to drive a majority of the fluorine ions in the fluorinated gate electrode into the underlying nitrogen-containing dielectric layer. The annealing is performed at a temperature substantially in a range of 600° to 1100° C., with a preferred range of 750° to 950° C. The lower annealing temperature range, from 600° to 750° C., may be possible with a thin gate electrode thickness and is also dependent on the implant energy used during implantation. The fluorine diffuses from the gate electrode into the nitrogen-containing dielectric to form a fluorinated nitrogen-containing dielectric 112'. It is expected that the fluorine ions will concentrate at the interfacial region to form a fluorinated nitrogen-containing interfacial region 114'. Furthermore, it is likely that fluorine will also concentrate at the interface between the annealed gate electrode 120' and the bulk portion 116 of the dielectric layer 112'.

The presence of fluorine increases the peak of the transconductance at a low gate voltage thereby counteracting the loss of peak transconductance due to the presence of nitrogen. Thus, by having both nitrogen and fluorine in the interfacial region, a net gain in device speed, at both low and high gate voltages, can be achieved. By performing the steps illustrated in FIGS. 13–16, it is possible to controllably form a fluorinated nitrogen-containing dielectric overlying a substrate. This fluorine-containing and nitrogen-containing dielectric is very useful as a gate dielectric because it combines the benefits of both fluorine and nitrogen into a single layer.

It may also advantageous to add trace amounts of chlorine during the oxidation step into the nitrogen-containing dielectric. Thereafter, what is formed is a chlorinated nitrogen-containing dielectric. Then fluorine is implanted into the gate electrode to form a fluorinated chlorinated nitrogen-containing dielectric. The presence of chlorine enables the removal of sodium and other metals from the device. Thus, this method provides a method to introduce chlorine into the device.

Figure 17:
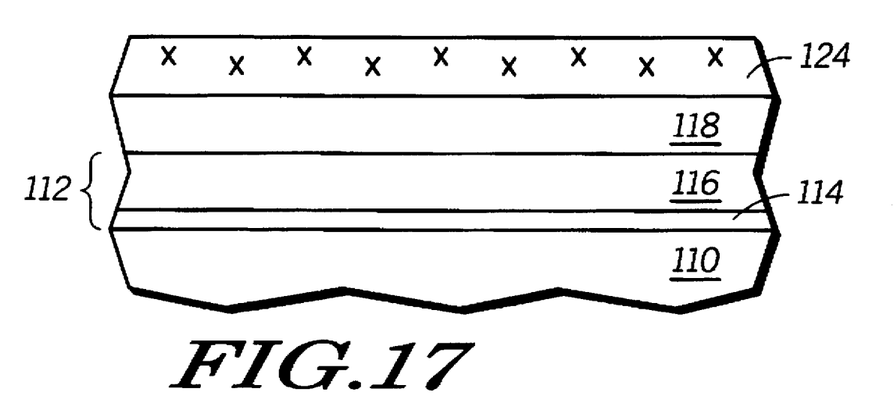
FIGS. 17-18 illustrate, in cross-section, alternative process steps for forming a dielectric having improved performance in accordance with a second embodiment of the invention.
Figure 18:
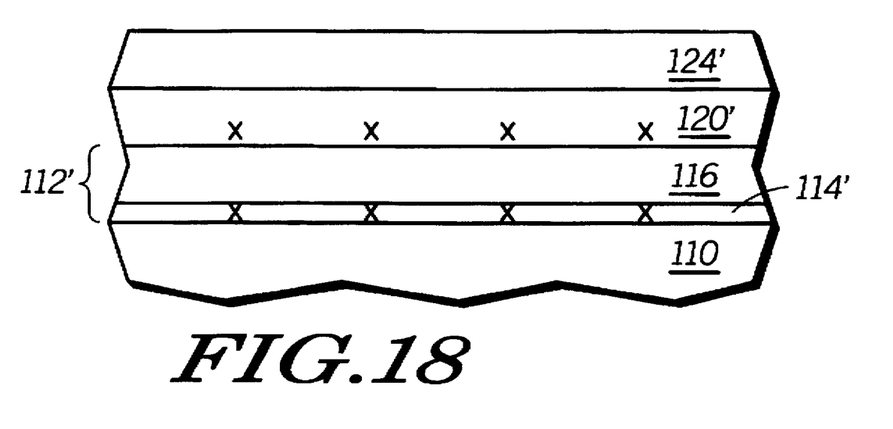

FIGS. 17-18 illustrate, in cross-section, alternative process steps for forming a dielectric having improved performance in accordance with another embodiment of the invention. In FIG. 17, a fluorine-containing dielectric 124 is formed overlying the gate electrode 118 which has been formed in a previous step substantially similar to FIG. 14. The fluorine-containing dielectric 124 can be formed with various methods. In a first method, the fluorine-containing dielectric 124 is grown by oxidizing a top surface portion of the gate electrode 118 with oxygen ($O_2$) and $NF_3$ or a fluorine-containing gas. This step forms a fluorinated thermal oxide.

Then in FIG. 118, an annealing step is performed to drive the fluorine in the top dielectric layer into the underlying nitrogen-containing dielectric to form the fluorinated nitrogen-containing dielectric 112'. The annealing temperature should be substantially in the range of 600° to 1100° C., with a preferred range of 750° to 950° C. Again, it is expected that the fluorine will concentrate in the interfacial region 114'. Also, some fluorine is expected to concentrate at the interface between the gate electrode 120' and the bulk thermal oxide layer 116 of the fluorinated nitrogen-containing dielectric 112' as well as the fluorine-containing dielectric 124'.

A second method of forming the fluorine containing dielectric 124 involves oxidizing the top surface of the gate electrode with $O_2$ to form an oxide layer. Then fluorine, preferably pure fluorine ions, can be implanted into this top oxide layer. However, it is also possible to implant other fluorine-containing species which do not contain a silicon dopant, such as boron, arsenic, and phosphorus. Annealing may then be performed to drive the fluorine into the underlying nitrogen-containing dielectric to form the fluorinated nitrogen-containing dielectric.

A third method of forming the fluorine containing dielectric 124 also involves oxidizing the top surface of the gate electrode with $O_2$ to form an oxide layer. It is then annealed in a fluorine-containing ambient, such as $NF_3$, so as to introduce fluorine into the dielectric. This annealing step should also drive the fluorine through the underlying gate electrode 120' into the underlying nitrogen-containing dielectric layer to form the fluorinated nitrogen-containing dielectric of the present invention.

As can be seen from the foregoing methods, it is critical that nitrogen be introduced into the gate dielectric before fluorine. The reason is that the fluorine-silicon bond is stronger than that of the nitrogen-silicon bond. Therefore, if fluorine were introduced first, then it becomes much more difficult to find available silicon to bond to nitrogen because the nitrogen cannot break the existing fluorine-silicon bonds. Thus, the sequence in the methods of the present invention provides a much more controllable process than the prior art.

The foregoing description and illustrations contained herein demonstrate many of the advantages associated with the present invention. In particular, it has been revealed that an increase of device peak transconductance is made possible by introducing fluorine into a gate dielectric. Moreover, the introduction of nitrogen into the same gate dielectric increases the transconductance at high electric fields. Hence, a combination of both fluorine and nitrogen into the same gate dielectric increases the overall current drive to improve device speed. The present invention enables manufacturable and controllable processes to be used to successfully incorporate both fluorine and nitrogen into the gate dielectric, which was not achievable by the prior art. Yet another advantage is that the present invention also allows for the incorporation of chlorine into the gate dielectric to remove sodium and other metals to further improve device reliability and performance.

In summary, the nitrogen/fluorine thermal oxide methods of FIGS. 13-18 can be combined with the composite dielectric structure teachings of FIGS. 1-12 to form an improved semiconductor dielectric. The inventive semiconductor dielectric results in reduced stress, improved integrated circuit lifetime, reduced breakdown voltage failures, reduced boron penetration, improved radiation hardening, and reduced micropore-related problems while minimizing mobility reduction due to nitrogen and etch-related problems and boron penetration due to fluorine. The semiconductor dielectric can be used, for example, as a gate dielectric or an inter-conductor dielectric.

Thus it is apparent that there has been provided, in accordance with the invention, a method for forming a dielectric having both fluorine and nitrogen therein for improved performance that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the addition of chlorine into the gate dielectric region may be possible with any of the above methods. In addition, the invention is not limited to a gate dielectric or tunnel dielectric, as the methods are equally applicable for forming an interpoly dielectric for non-volatile memory applications or for forming stacked gate dielectrics. Therefore, it is intended that this invention encompasses all such variations and modifications falling within the scope of the appended claims.

While the present invention has been illustrated and described with reference to specific embodiments, further modifications and improvements will occur to those skilled in the art. For example, the improved semiconductor dielectric can be used to protect any type of transistor or may be used to form a gate dielectric for any transistor. Lightly doped drain (LDD) regions, elevated source and drain regions, and other known structures may be used with the improved semiconductor dielectric. The thin interface layers 13, 13', 13", and/or 13b described herein can be used for other forms of protection. The thin interface layers 13, 13', 13", and 13b can be used to protect underlying layers from hydrogen diffusion. Hydrogen diffusion may occur during passivation, epitaxial growth, or other processing steps. The improved semiconductor dielectric may also be used to protect and insulate thin film transistors (TFTs), silicon on insulator (SOI) transistors, or other silicon based devices. There are many ways to expose a surface of a base layer to one of either nitrogen or fluorine to form a thin interface layer. Many dielectric materials may be used to form the deposited dielectric layer 16 described herein. The gate oxides taught herein may be used for vertical MOSFETs or transistors wherein current flow is perpendicular to a top surface of the substrate.

In another form it is to be understood that the gate electrode can be formed above the composite dielectric and be followed by a nitrogen implant which is then followed by a fluorine implant to create the fluorine/nitrogen interface. In addition, the nitrogen implant followed by the fluorine implant can be performed after composite formation or partial formation and before gate electrode formation. It is to be understood, therefore, that this invention is not limited to the particular forms illustrated and that it is intended in the appended claims to cover all modifications that do not depart from the spirit and scope of this invention.

We claim:

1. A method for making a dielectric comprising the steps of:

providing a substrate having a surface portion;

oxidizing the surface portion of the substrate using a nitrogen-containing oxidant to form a nitrogen-containing dielectric, the nitrogen residing in a concentration most-heavily near the surface portion rather than at a top portion of the nitrogen-containing dielectric;

depositing a deposited dielectric layer over the nitrogen-containing dielectric, the deposited dielectric and the nitrogen-containing dielectric each containing micropores which misalign to one another;

forming a gate electrode overlying the deposited dielectric;

implanting fluorine into the gate electrode to form a fluorinated gate electrode; and annealing the fluorinated gate electrode to drive the fluorine into the nitrogen-containing dielectric to form a fluorinated nitrogen-containing dielectric where the fluorine is also concentrated most heavily at the surface portion.

2. The method of claim 1, wherein the step of oxidizing the surface portion is performed with the nitrogen-containing gas being selected from a group consisting of: nitrous oxide ($N_2O$), nitric oxide (NO), nitrogen dioxide ($NO_2$), nitrogen ($N_2$) and ammonia ($NH_3$).

3. The method of claim 1, wherein the step of providing the substrate comprises providing a material selected from a group consisting of single-crystalline silicon and polycrystalline silicon.

4. The method of claim 1, wherein the step of implanting fluorine comprises implanting pure fluorine ions.

5. The method of claim 1, wherein the step of annealing the fluorinated gate electrode is performed at a temperature substantially in a range of 600° to 1000° C.

6. The method of claim 1, further comprising the step of introducing chlorine into the nitrogen-containing dielectric.

7. A method for making a dielectric comprising the steps of:

providing a substrate having a surface portion;

oxidizing the surface portion of the substrate to form an oxide layer having a first plurality of micropores;

annealing the oxide layer with a nitrogen-containing ambient to form a nitrogen-containing dielectric;

forming a deposited dielectric region overlying the nitrogen-containing dielectric wherein the deposited dielectric has a second plurality of micropores misaligned to the first plurality of micropores;

forming a gate electrode overlying the deposited dielectric;

implanting fluorine into the gate electrode to form a fluorinated gate electrode after the step of annealing the oxide layer; and heating the fluorinated gate electrode to drive the fluorine into the nitrogen-containing dielectric to form a fluorinated nitrogen-containing dielectric.

8. The method of claim 7, wherein the step of annealing the oxide layer is performed in an ambient containing a gas selected from a group consisting of: nitrous oxide ($N_2O$), nitric oxide (NO), nitrogen dioxide ($NO_2$), and ammonia ($NH_3$).

9. The method of claim 7, wherein the step of providing the substrate comprises providing a material selected from a group consisting of single-crystalline silicon, polycrystalline silicon, interpolysilicon dielectric, and tunnel dielectric.

10. The method of claim 7, wherein the step of implanting fluorine comprises implanting pure fluorine ions.

11. The method of claim 7, wherein the step of annealing the fluorinated gate electrode is performed at a temperature substantially in a range of 600° to 1000° C.

12. The method of claim 7, further comprising the step of introducing chlorine into the nitrogen-containing dielectric.

13. A method for making a dielectric comprising the steps of:

providing a silicon substrate having a surface portion;

forming a nitrogen-containing thermal dielectric on the surface portion of the silicon substrate by exposing the silicon substrate to an oxygen containing thermal oxide growth species;

depositing a deposited oxide over the nitrogen-containing thermal dielectric;

forming a gate electrode overlying the deposited oxide; and forming a fluorinated dielectric, which contains fluorine atoms, overlying the gate electrode, wherein the fluorine atoms in the fluorinated dielectric are driven via heat through the gate electrode into the nitrogen-containing dielectric to form a fluorinated nitrogen-containing thermal dielectric from the nitrogen-containing thermal dielectric.

14. The method of claim 13, wherein the step of growing the fluorinated dielectric is performed by oxidizing a top surface portion of the gate electrode with $O_2$ and a fluorine-containing ambient, to form a fluorinated oxide.

15. The method of claim 13, further comprising the step of annealing the fluorinated oxide in a temperature range of 600° to 1000° C. to drive the fluorine into the nitrogen-containing dielectric to form the fluorinated nitrogen-containing dielectric.

16. The method of claim 14, wherein the step of forming the fluorinated dielectric comprises the steps of:

oxidizing a top surface of the gate electrode with $O_2$ to form an oxide layer; and annealing the oxide layer in a fluorine-containing ambient to introduce fluorine into the oxide layer and to drive the fluorine into the nitrogen-containing dielectric.

17. The method of claim 14, Wherein the step of growing the fluorinated dielectric comprises the steps of:

oxidizing a top surface of the gate electrode with $O_2$ to form an oxide layer; and implanting fluorine ions into the oxide layer.

18. The method of claim 14, further comprising the step of annealing the fluorinated dielectric in a temperature range of 600° to 1000° C. to drive the fluorine into the nitrogen-containing dielectric to form the fluorinated nitrogen-containing dielectric.

19. The method of claim 14, further comprising the step of introducing a chlorine-containing species into the surface portion of the silicon substrate during the step of forming the nitrogen-containing dielectric.

* * * * *